United States Patent [19]

Moriya et al.

[11] Patent Number: 4,972,677
[45] Date of Patent: Nov. 27, 1990

[54] METHOD OF CLEANING WAFERS OR THE LIKE

[75] Inventors: Kozo Moriya, Ibaragi; Tadashi Ookatsu, Kobe, both of Japan

[73] Assignee: The BOC Group, Inc., Murray Hill, N.J.

[21] Appl. No.: 308,856

[22] Filed: Feb. 9, 1989

[30] Foreign Application Priority Data

Mar. 5, 1988 [JP] Japan ................... 63-51870

[51] Int. Cl.$^5$ .............................. F17C 9/02
[52] U.S. Cl. ...................... 62/50.2; 62/303; 62/384
[58] Field of Search ............ 62/12, 18, 303, 384, 62/52

[56] References Cited

U.S. PATENT DOCUMENTS

| 1,831,644 | 11/1931 | Adair et al. | 62/18 |
| 1,891,125 | 12/1932 | Van Gessel | 62/18 |
| 4,492,593 | 1/1985 | Diaz | 62/18 |
| 4,717,406 | 1/1988 | Giacobbe | 62/18 |

Primary Examiner—Ronald C. Capossela
Attorney, Agent, or Firm—Carol A. Nemetz; R. Hain Swope; Larry R. Cassett

[57] ABSTRACT

Liquid carbon dioxide substantially free of particles is prepared by evaporating liquid carbon dioxide, passing the resulting gaseous carbon dioxide through a suitable filter to remove particles therefrom and cooling the particle-free gas to reliquefy it.

5 Claims, 1 Drawing Sheet

METHOD OF CLEANING WAFERS OR THE LIKE

The present invention relates to a method of supplying liquefied carbon dioxide containing a significantly reduced number of particles and also to a method of removing particles, oil, and the like, from the surface of a substrate by the use of said liquefied carbon dioxide.

BACKGROUND OF THE INVENTION

Liquefied carbon dioxide has excellent properties as a solvent and is known to be capable of readily removing particles, oil and other contaminants from a substrate. Wafers used in the semiconductor industry, in particular, require substantially complete removal of the particles adhering even in trace amounts, to the wafer surface.

It has been found that, even commercially available high-purity (99.999%) liquefied carbon dioxide contains a large number of particles. For example, a sample of commercial 99.999% pure liquid carbon dioxide was found to contain $10^8$ particles larger than 0.3 micrometer per cubic foot.

If a substrate requiring ultracleaning, such as a semiconductor wafer, is cleaned with dry ice snow obtained from such carbon dioxide, particles are removed from the substrate surface but, at the same time, particles contained in the dry ice snow are deposited in their place. For this reason, it has heretofore been impossible to use such commercially available high-purity liquefied carbon dioxide.

It is general practice to remove particles from liquefied carbon dioxide by means of a filter. However, it has been shown in an experiment in which liquefied high-purity carbon dioxide was passed through a filter in the liquid state that substantially no particles can be removed from liquefied carbon dioxide by means of a filter.

SUMMARY OF THE INVENTION

In accordance with the present invention, liquefied carbon dioxide is evaporated and the resulting carbon dioxide gas passed through a filter. The gas is then liquefied substantially particle free.

DETAILED DESCRIPTION OF THE INVENTION

Figure 1:
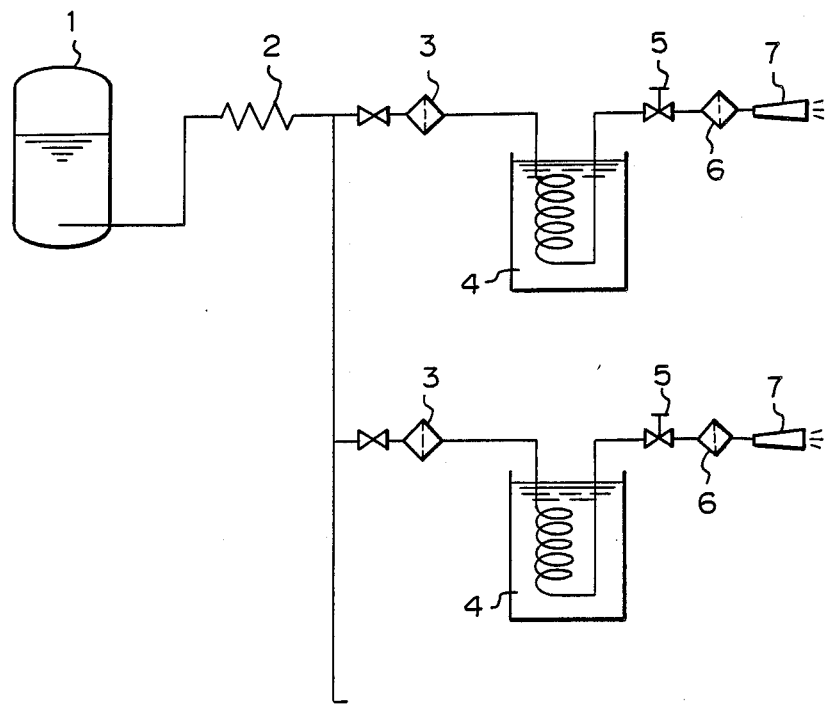
FIG. 1 shows a preferred form of an apparatus for carrying out the method of the present invention.

In accordance with the present invention, it has been found that it is possible to remove substantially all particles from carbon dioxide which is in the gaseous state. More specifically, it is possible to obtain liquefied carbon dioxide containing a significantly reduced number of particles by evaporating liquefied carbon dioxide, passing the resulting carbon dioxide gas through a filter to remove substantially all particles therefrom and then reliquefying the resulting ultrapure carbon dioxide gas.

This invention relates to a method of supplying liquefied carbon dioxide containing no or substantially no particles, comprising the steps of: evaporating liquefied carbon dioxide into carbon dioxide gas; passing the resulting carbon dioxide gas through a filter to capable of removing ultrafine particles therefrom; and reliquefying said carbon dioxide gas by cooling. Suitable filters are, for example, those commercially available which have the capability of removing submicrometer particles, i.e. 0.2 micrometer and below, from a gas.

This invention also relates to a method of removing particles or the like from the surface of a substrate to be cleaned, comprising allowing the liquefied carbon dioxide containing no or substantially no particles supplied by the method described herein to be jetted out from a nozzle to thereby blow carbon dioxide gas and/or liquefied carbon dioxide containing dry ice snow over the surface of the substrate.

Referring to FIG. 1, there is shown a method of supplying liquefied carbon dioxide containing a substantially reduced number of particles.

Liquefied carbon dioxide which is supplied from a tank 1 is passed through an evaporator 2 where it is changed into carbon dioxide gas which is then passed through a filter 3 where particles are removed therefrom. Thereafter, the carbon dioxide gas is reliquefied in a liquefier 4 and this reliquefied carbon dioxide gas is passed successively through a needle valve 5 and a filter 6 and then jetted out from a nozzle 7 in the form of fine dry ice snow. This dry ice snow may be blown over a substrate to be cleaned, such as a wafer, to remove particles from the surface thereof.

The piping, valve and nozzle, e.g. equipment, which are installed on the downstream side of the filter 3 are formed using an electro- or chemically-polished pipe having ultra smooth and clean inner surfaces so as to prevent to the greatest degree possible the generation of additional particles.

A commercially available carbon dioxide container (for either carbon dioxide gas or liquefied carbon dioxide) may be used in place of the carbon dioxide tank 1.

Examples of substrates which may be effectively cleaned with the method of the present invention include wafers, compact disks, laser disks, lenses, etc.

Generally speaking, when liquefied carbon dioxide is blown over the surface of a substrate to be cleaned, such as a wafer, it is rapidly cooled by the substrate and thus condensed on the surface thereof, resulting in the substrate becoming wet with dew. It will take some time to dry such a wet object and there is also a possibility that the surface of the object will be contaminated by the water attached thereto. In order to avoid these problems, the substrate to be cleaned is preferably placed in a room filled with a nitrogen atmosphere when liquefied carbon dioxide is blown over it. The substrate may also be heated, e.g., with an electric heater, when liquefied carbon dioxide is blown over it. Preferably, both the heating and the nitrogen atmosphere are utilized simultaneously.

It may be surmised that the same result could be attained by supplying the particle-lean high purity liquefied carbon dioxide from a clean container or tank. But this idea is not practical since the need to first clean the inner surface of the carbon dioxide storage tank by complex electropolishing and then to wash them with ultrapure water adds significantly to the production cost of the container. Instead, as show in FIG. 1, the liquefier 4 may be set up on the wafer cleaning site and liquefied carbon dioxide is directly supplied from the liquefier, and this approach is inexpensive and hence practical. The liquefier 4 can be readily fabricated of an electropolished tube. The present invention provides an inexpensive method for on-site supply of liquefied carbon dioxide whose particle content is sufficiently low to justify its use in the cleaning of chip wafers and other products that require ultra cleanliness.

What is claimed is:

1. A method of supplying liquefied carbon dioxide substantially free of particles, comprising the steps of:
   evaporating liquefied carbon dioxide gas;
   passing the resulting carbon dioxide gas through a suitable filter to remove particles therefrom; and
   reliquefying said carbon dioxide gas by cooling wherein the filtered carbon dioxide is passed through equipment having ultra smooth and clean inner surfaces.

2. A method of removing particles or the like from the surface of a substrate to be cleaned comprising jetting liquified carbon dioxide substantially free of particles, prepared by a method comprising the steps of: evaporating liquified carbon dioxide gas; passing the resulting carbon dioxide gas through a suitable filter to remove particles therefrom; and reliquifying said carbon dioxide gas by cooling, from a nozzle to thereby blow carbon dioxide gas and liquified carbon dioxide containing dry ice snow over the surface of the substrate.

3. A method in accordance with claim 2, wherein said substrate is retained in a nitrogen atmosphere.

4. A method in accordance with claim 2, wherein the substrate is heated.

5. A method in accordance with claim 3, wherein the substrate is heated.

* * * * *